(12) United States Patent
Isaka (10) Patent No.: US 11,052,464 B2
(45) Date of Patent: Jul. 6, 2021

(54) COATED CUTTING TOOL

(71) Applicant: MOLDINO Tool Engineering, Ltd., Tokyo (JP)

(72) Inventor: Masakazu Isaka, Yasu (JP)

(73) Assignee: MOLDINO Tool Engineering, Ltd., Tokyo (JP)

( * ) Notice: Subject to any disclaimer, the term of this patent is extended or adjusted under 35 U.S.C. 154(b) by 0 days.

(21) Appl. No.: 16/643,932

(22) PCT Filed: Nov. 19, 2018

(86) PCT No.: PCT/JP2018/042653
§ 371 (c)(1),
(2) Date: Mar. 3, 2020

(87) PCT Pub. No.: WO2019/098363
PCT Pub. Date: May 23, 2019

(65) Prior Publication Data
US 2020/0376567 A1  Dec. 3, 2020

(30) Foreign Application Priority Data
Nov. 20, 2017 (JP) .............................. JP2017-223099

(51) Int. Cl.
*B23B 27/14* (2006.01)
*B23C 5/16* (2006.01)
*C23C 14/06* (2006.01)

(52) U.S. Cl.
CPC ............ *B23B 27/14* (2013.01); *B23B 27/148* (2013.01); *B23C 5/16* (2013.01); *C23C 14/06* (2013.01); *C23C 14/0664* (2013.01)

(58) Field of Classification Search
CPC ....... B23B 27/14; B23B 27/1148; B23C 5/16; C23C 14/06; C23C 14/0664
(Continued)

(56) References Cited

U.S. PATENT DOCUMENTS

2007/0269610 A1* 11/2007 Fukui ................. C23C 14/0641
427/497
2011/0183131 A1* 7/2011 Maeda ..................... C23C 28/42
428/216
2017/0096733 A1   4/2017 Sasaki et al.

FOREIGN PATENT DOCUMENTS

JP    2000-334606 A    12/2000
JP    2006-152321 A     6/2006
(Continued)

OTHER PUBLICATIONS

International Search Report dated Feb. 12, 2019, issued for PCT/JP2018/042653 and English translation thereof.
(Continued)

*Primary Examiner* — Archene A Turner
(74) *Attorney, Agent, or Firm* — Locke Lord LLP (57) ABSTRACT

Provided is a coated cutting tool, which includes a hard coating film containing a layer (c) which is a layered coating film made by alternately layering a nitride or carbonitride layer (c1) that contains, with respect to the total amount of metal elements (including metalloid elements), at least 55 atom % aluminum (Al), chromium (Cr) having the second highest content percentage, and at least silicon (Si), and a nitride or carbonitride layer (c2) that contains, with respect to the total amount of metal elements (including metalloid elements), at least 55 atom % aluminum (Al) and titanium (Ti) having the second highest content, each layer having a thickness of 50 nm or less. A peak intensity Ih ascribable to an hcp (010) plane of AlN in the layer (c) and the total peak intensity Is ascribable to other predetermined crystal phases satisfy a relationship of $Ih \times 100/Is \leq 15$.

20 Claims, 7 Drawing Sheets

(58) Field of Classification Search
USPC .......... 51/307, 309; 428/216, 217, 336, 697, 428/698, 699, 704
See application file for complete search history.

(56) References Cited

FOREIGN PATENT DOCUMENTS

| JP | 2006-299399 A | 11/2006 |
|----|---------------|---------|
| JP | 2008-080447 A | 4/2008 |
| JP | 2011-011287 A | 1/2011 |
| JP | 2012-035378 A | 2/2012 |
| JP | 5673904 B1 | 2/2015 |
| JP | 2016-064487 A | 4/2016 |
| JP | 2016-124086 A | 7/2016 |
| JP | 5979438 B2 | 8/2016 |
| JP | 2017-001147 A | 1/2017 |
| WO | 2013/081232 A1 | 6/2013 |
| WO | 15/141743 A1 | 9/2015 |

OTHER PUBLICATIONS

International Preliminary Report on Patentability dated Jul. 16, 2019, issued for PCT/JP2018/042653 and English translation thereof.
Supplementary European Search Report dated Mar. 17, 2021, issued for European Patent Application No. 18877499.6.

* cited by examiner

COATED CUTTING TOOL

TECHNICAL FIELD

The present invention relates to a coated cutting tool.

Priority is claimed on Japanese Patent Application No. 2017-223099, filed on Nov. 20, 2017, the contents of which are incorporated herein by reference.

BACKGROUND ART

Conventionally, as technology for improving a lifespan of a cutting tool, surface treatment technology for coating a surface of the cutting tool with a hard coating film formed of various ceramics is adopted. Since a composite nitride coating film of Ti and Si in the hard coating film (which may hereinafter be described as TiSiN) has high hardness and excellent wear resistance, the cutting tool on which TiSiN is formed exhibits excellent durability in cutting machining of, for instance, high hardness steel.

For example, a coated cutting tool coated with TiSiN in which $Si_3N_4$ and Si are present in a compound phase as independent phases is proposed in Patent Literature 1. Further, a coated cutting tool coated with TiSiN in which fine crystals and amorphous portions are mixed in a microstructure is proposed in Patent Literature 2.

Improving the durability of a coated cutting tool by optimizing a coating film structure provided between a substrate and TiSiN is also proposed. For example, a coated cutting tool in which a layered coating film formed by alternately layering layers at a nanolevel thickness is provided between a substrate and TiSiN is disclosed in Patent Literatures 3 and 4.

CITATION LIST

Patent Literature

[Patent Literature 1]
Japanese Unexamined Patent Application, First Publication No. 2000-334606
[Patent Literature 2]
Japanese Unexamined Patent Application, First Publication No. 2008-80447
[Patent Literature 3]
Japanese Unexamined Patent Application, First Publication No. 2006-299399
[Patent Literature 4]
Japanese Unexamined Patent Application, First Publication No. 2006-152321

SUMMARY OF INVENTION

Technical Problem

According to studies of the inventors of the present invention, it was ascertained that, in a coated cutting tool in which a hard coating film having high hardness is provided on an upper layer of the conventional layered coating film, damage to the tool may become large in a severe usage environment in which a load on the tool is high, for instance in which high hardness steel having HRC of 50 or more is machined with high efficiency, and there is room for improvement in durability.

Solution to Problem

An aspect of the present invention provides a coated cutting tool that includes a substrate and a hard coating film formed on the substrate, wherein the hard coating film has: a layer (b) disposed on the substrate and composed of a nitride or a carbonitride; and a layer (c) disposed on the layer (b) and which is a layered coating film made by alternately layering a nitride or carbonitride layer (c1) and configured to contain, with respect to a total amount of metal elements (including metalloid elements), at least 55 atom % aluminum (Al), chromium (Cr) having a second highest content percentage, and at least silicon (Si), and a nitride or carbonitride layer (c2) including, with respect to the total amount of metal elements (including metalloid elements), at least 55 atom % aluminum (Al), and titanium (Ti) having a second highest content, each layer having a thickness of 50 nm or less; and a layer (d) disposed on the layer (c) and having higher hardness than the layer (c), and in a case where, in an intensity profile obtained from a selected area diffraction pattern of a transmission electron microscope, a peak intensity ascribable to a (010) plane of AlN having a hexagonal closest packed structure is defined as Ih, and a sum total of a peak intensity ascribable to a (111) plane of AlN, a (111) plane of TiN, a (111) plane of CrN, a (200) plane of AlN, a (200) plane of TiN, a (200) plane of CrN, a (220) plane of AlN, a (220) plane of TiN, and a (220) plane of CrN, all of which have face-centered cubic structures, and a peak intensity ascribable to a (010) plane of AlN, a (011) plane of AlN, and a (110) plane of AlN, all of which have hexagonal closest packed structures, is defined as Is, the layer (c) satisfies a relationship of $Ih \times 100/Is \leq 15$.

The layer (c1) may be a nitride or a carbonitride that contains, with respect to the total amount of metal elements (including metalloid elements), at least 55 atom % aluminum (Al), at least 20 atom % chromium (Cr), and at least 1 atom % silicon (Si), and the layer (c2) may be a nitride or a carbonitride that contains, with respect to the total amount of metal elements (including metalloid elements), at least 55 atom % aluminum (Al) and at least 20 atom % titanium (Ti).

The layer (c) may satisfy a relationship of $Ih \times 100/Is = 0$.

With respect to a total thickness of the hard coating film, the layer (c) may be a thickest film.

The layer (c) may be composed of columnar particles, and an average width of the columnar particles may be 90 nm or less.

The layer (d) may be a nitride or a carbonitride that contains, with respect to the total amount of metal elements (including metalloid elements), at least 70 atom % titanium (Ti) and at least 5 atom % silicon (Si).

The layer (c2) may contain one or two or more elements selected from elements of Groups 4a, 5a, and 6a of the periodic table, and Si, B, and Y.

A layer (a) in which a nano-beam diffraction pattern is indexed in a crystal structure of WC and whose thickness is 1 nm or more and 10 nm or less may be provided between the substrate and the layer (b).

Advantageous Effects of Invention

According to the present invention, a coated cutting tool having excellent durability can be provided.

DESCRIPTION OF EMBODIMENTS

The inventors of the present invention studied a technique for improving a tool lifespan in a coated cutting tool on which a hard coating film having high hardness, such as TiSiN, is provided. The inventors found that a cutting tool made of high hardness steel exhibits excellent durability can be obtained by reducing AlN having an hcp structure contained in a microstructure at a layered coating film in which an Al-rich AlCrN-based nitride or carbonitride and an Al-rich AlTiN-based nitride or carbonitride are alternately layered at a nanolevel, and thus achieved the present invention. Hereinafter, details of the present embodiment will be described.

Figure 1:
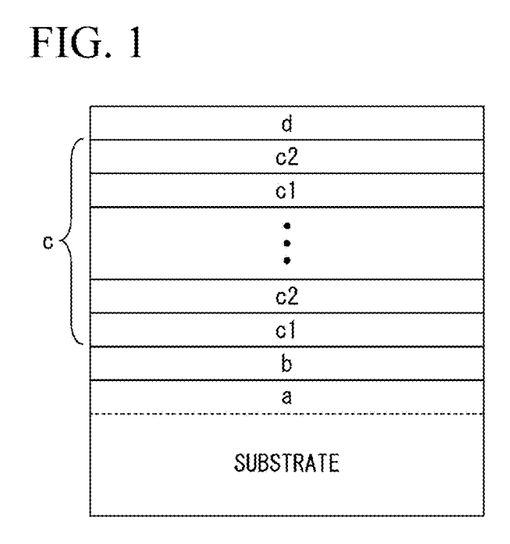
FIG. 1 is a view illustrating a cross-sectional structure of a coated cutting tool of an embodiment.

A coated cutting tool of the present embodiment has, for instance, a cross-sectional structure illustrated in FIG. 1. The coated cutting tool of the present embodiment has a substrate and a hard coating film formed on the substrate. The hard coating film has a layer a provided as needed, a layer b formed of a nitride or a carbonitride, a layer c formed of a layered coating film, and a layer d formed of a hard coating film having higher hardness than the other layers from the substrate side in order. Hereinafter, each of the layers will be described in detail.

«Substrate»

In the coated cutting tool of the present embodiment, the substrate is not particularly limited, but a WC—Co-based superhard alloy having excellent intensity and toughness is preferably used as the substrate.

«Layer b»

The layer b according to the present embodiment is a nitride or a carbonitride disposed on the substrate. The layer b is an underlaid layer that enhances adhesion between the substrate and the layer c that is the layered coating film. Since the layer b disposed on the substrate is a nitride or a carbonitride, the coated cutting tool becomes a cutting tool in which the adhesion between the substrate and the hard coating film is excellent. The layer b preferably contains Al at 55 atom % or more with respect to the total amount of metal elements (including metalloid elements; the same applies below). Furthermore, Al of the layer b is preferably 60 atom % or more. The layer b is set to be rich in Al, and thereby a difference in composition between the layer b and the layer c formed of an Al-rich layered coating film (to be described below) is reduced, and adhesion is improved. Further, the layer b is set to be rich in Al, and thereby heat resistance is raised in the entire hard coating film. Furthermore, the layer b is preferably a nitride having excellent heat resistance and wear resistance. However, if a content percentage of Al of the layer b becomes too high, AlN having a brittle hcp structure is increased. For that reason, Al of the layer b is preferably 75 atom % or less. Further, to further enhance the adhesion with the layer c that is the layered coating film, the layer b preferably contains metal elements which the layer c1 or the layer c2 (to be described below) contains. Further, a peak intensity ascribable to an fcc structure in an intensity profile obtained from an X-ray diffraction or a selected area diffraction pattern of a transmission electron microscope preferably shows the maximum in the layer b. Thus, AlN having an hcp structure contained in a microstructure of the layer c is reduced in the layer c that is the Al-rich layered coating film provided on the layer b. AlN having a brittle hcp structure is reduced, and thus the durability of the coated cutting tool is improved. If the layer b is a nitride or a carbonitride, the layer b may be composed of a plurality of layers having different compositions.

If the thickness of the layer b becomes too thin, the adhesion with the substrate or the layer c is easily lowered. If the thickness of the layer b becomes too thick, chipping easily occurs. In order for the coated cutting tool to realize more excellent durability, the thickness of the layer b is preferably 0.1 μm or more and 5.0 μm or less. Furthermore, the thickness of the layer b is preferably 0.2 μm or more. Furthermore, the thickness of the layer b is preferably 3.0 μm or less. Upper and lower limit values of the thickness of the layer b can be appropriately combined.

«Layer c»

The layer c according to the present embodiment is an Al-rich layered coating film that is provided between the layer b that is the aforementioned underlaid layer and the layer d having high hardness (to be described below).

To be specific, the layer c is a layered coating film formed by alternately layering a nitride or carbonitride layer c1 that contains, with respect to the total amount of metal elements (including metalloid elements), at least 55 atom % aluminum (Al), chromium (Cr) having the second highest content percentage, and at least silicon (Si), and a nitride or carbonitride layer c2 that contains, with respect to the total amount of metal elements (including metalloid elements), at least 55 atom % aluminum (Al) and titanium (Ti) having the second highest content, each layer having a thickness of 50 nm or less.

Furthermore, the layer c is preferably a layered coating film formed by alternately layering a nitride or carbonitride layer c1 that contains, with respect to the total amount of metal elements, at least 55 atom % aluminum (Al), at least 20 atom % chromium (Cr), and at least 1 atom % silicon (Si), and a nitride or carbonitride layer c2 that contains, with respect to the total amount of metal portions, at least 55 atom % aluminum (Al) and at least 20 atom % titanium (Ti), each layer having a thickness of 50 nm or less.

An Al-rich AlCrN-based hard coating film and an Al-rich AlTiN-based hard coating film, which are different in composition system from each other, are alternately layered at a nanolevel, and thereby progress of coating film breakdown is easily curbed. Further, it is difficult to contain AlN having an hcp structure in the layer c, heat resistance is increased in the entire hard coating film, and the durability of the coated cutting tool is improved.

An average composition of the layer c preferably contains Al having a content percentage of 55 atom % or more and 75 atom % or less. Furthermore, the average composition of the layer c preferably contains Al having a content percentage of 60 atom % or more and 70 atom % or less. Further, the average composition of the layer c preferably contains Cr and Ti having a total content percentage of 20 atom % or more and 40 atom % or less. In addition, the average composition of the layer c preferably contains Si having a content percentage of 0.5 atom % or more and 5 atom % or less. Furthermore, the average composition of the layer c preferably contains Si having a content percentage of 1 atom % or more and 3 atom % or less. The average composition of the layer c may be calculated by measuring a range of 500 nm×500 nm or more.

Furthermore, AlN having an hcp structure contained in a microstructure needs to be small in the layer c. The inventors found that, even in a case where a peak intensity of AlN having an hcp structure is not ascertained through X-ray diffraction in an evaluation of the layer c, AlN having a brittle hcp structure may be contained in the microstructure. The inventors ascertained that the durability of the coated cutting tool is improved by reducing AlN having the brittle hcp structure contained in the microstructure of the layer c.

To quantitatively obtain an amount of AlN having the hcp structure that is present in the microstructure at the hard coating film, a selected area diffraction pattern is obtained in a processed cross section of the hard coating film using a transmission electron microscope, and an intensity profile obtained from the selected area diffraction pattern is used. To be specific, a relationship of Ih×100/Is is evaluated in the intensity profile of the selected area diffraction pattern of the transmission electron microscope. Ih and Is are defined as follows.

Ih is a peak intensity ascribable to a (010) plane of AlN having an hcp structure.

Is is the sum of a peak intensity ascribable to a (111) plane of AlN, a (111) plane of TiN, a (111) plane of CrN, a (200) plane of AlN, a (200) plane of TiN, a (200) plane of CrN, a (220) plane of AlN, a (220) plane of TiN, and a (220) plane of CrN, each of which has an fcc structure, and a peak intensity ascribable to a (010) plane of AlN, a (011) plane of AlN, and a (110) plane of AlN, each of which has an hcp structure.

By evaluating a relationship between Ih and Is, AlN having an hcp structure contained in the microstructure can be quantitatively evaluated in the hard coating film in which the peak intensity ascribable to AlN having an hcp structure is not ascertained by an X-ray diffraction. A smaller value of Ih×100/Is means that AlN having a brittle hcp structure that is present in the microstructure of the layer c is smaller. The inventors ascertained that, in a case where the value of Ih×100/Is in the layer c is greater than 15, the durability of the coated cutting tool is easily lowered in a severe usage environment. In the present embodiment, the layer c is configured to satisfy Ih×100/Is≤15, and thereby the coated cutting tool having good durability is realized. Furthermore, the coated cutting tool of the present embodiment has a constitution in which the layer c satisfies Ih×100/Is≤10. Furthermore, the coated cutting tool of the present embodiment preferably has a constitution in which the layer c satisfies Ih×100/Is≤5.

Furthermore, the coated cutting tool of the present embodiment preferably has a constitution in which the peak intensity ascribable to the (010) plane of AlN having an hcp structure in the layer c is not ascertained. That is, the coated cutting tool of the present embodiment preferably has a constitution in which the layer c satisfies Ih×100/Is=0. Even in a case where a diffraction pattern of AlN having an hcp structure is not ascertained in the selected area diffraction pattern, if an amount of AlN is a minute amount, the value of Ih×100/Is may become zero (0) without appearance of a peak in the intensity profile. AlN having an hcp structure is preferably not ascertained in the selected area diffraction pattern of the layer c to further raise the durability of the coated cutting tool.

The microstructure of the layer c is composed of fine columnar particles. The columnar particles of which the layer c is composed extend in a thickness direction (a layering direction) of the layered coating film. By forming the layer c of fine columnar particles, the hardness and toughness of the hard coating film tend to be enhanced. To enhance the hardness and toughness of the hard coating film together, an average width of the columnar particles of the layer c is preferably 90 nm or less. However, if widths of the columnar particles become too small, the toughness of the hard coating film is lowered. For that reason, the average width of the columnar particles of the layer c is preferably 30 nm or less. The widths of the columnar particles can be checked by a cross-sectional observation image using a transmission electron microscope. The average width of the columnar particles is calculated as an average value of the widths of 10 or more columnar particles checked in the cross-sectional observation image.

«Layer c1»

The layer c1 is a nitride or a carbonitride that contains, with respect to the total amount of metal elements (including metalloid elements), at least 55 atom % aluminum (Al), chromium (Cr) having the second highest content percentage, and at least silicon (Si). Furthermore, the layer c1 is preferably a nitride or a carbonitride that contains, with respect to the total amount of metal elements, at least 55 atom % aluminum (Al), at least 20 atom % chromium (Cr), and at least 1 atom % silicon (Si).

A nitride or a carbonitride based on Al and Cr is a kind of film having excellent heat resistance. Especially, if the content percentage of Al is increased, the heat resistance of the hard coating film tends toward improvement, and the durability of the coated cutting tool is improved. Furthermore, the layer c1 is preferably a nitride that is excellent in heat resistance and wear resistance. To impart high heat resistance to the hard coating film, the layer c1 contains Al at 55 atom % or more. Furthermore, the content percentage of Al of the layer c1 is preferably 60 atom % or more. However, if the content percentage of Al becomes too high, AlN having a brittle hcp structure contained in a microstructure increases, and thus the durability of the hard coating film is lowered. For that reason, the content percentage of Al of the layer c1 is preferably 75 atom % or less, and more preferably 70 atom % or less.

If a content percentage of Cr becomes too low, wear resistance of the nitride or the carbonitride based on Al and Cr is lowered. To impart high wear resistance to the hard coating film, the layer c1 preferably contains Cr at 20 atom % or more. To use the layer c1 as an AlCr-based nitride or carbonitride, the layer c1 contains Cr at the second highest content after Al. However, if the content percentage of Cr in the layer c1 becomes too high, the content percentage of Al is relatively lowered, and thus heat resistance is lowered. For that reason, the content percentage of Cr of the layer c1 is preferably 40 atom % or less, and more preferably 35 atom % or less.

To further enhance the heat resistance and the wear resistance of the layered coating film, the total content percentage of Al and Cr of the layer c1 is preferably 85 atom % or more.

Because the nitride or the carbonitride of Al and Cr contains the element Si, a coating film structure becomes fine, and the wear resistance and the heat resistance are further improved. For that reason, the layer c1 contains Si, which improves the wear resistance and the heat resistance of the entire layered coating film. Further, since the hardness of the layered coating film constituting the layer c is improved, a difference in hardness from the layer d that has high hardness and is provided on the layered coating film is reduced, and adhesion is raised. To produce these effects, the layer c1 preferably contains Si at 1 atom % or more. However, if a content percentage of Si becomes too high, AlN having an hcp structure or an amorphous phase that is contained in a microstructure increases, and thus durability is lowered. For that reason, the content percentage of Si of the layer c1 is preferably 5 atom % or less, and more preferably 3 atom % or less.

Since the layer c1 and the layer c2 are alternately layered at a nanolevel, mutual compositions are mixed when coated. Further, the mutual compositions can be diffused. For that reason, the layer c1 can contain Ti that is essentially contained in the layer c2. However, to layer an Al-rich AlCrN-based hard coating film and an Al-rich AlTiN-based hard coating film that have different composition systems, a content percentage of Ti of the layer c1 is lower than that of the layer c2.

The layer c1 can contain metal elements other than Al, Cr, and Si. The layer c1 can contain, for instance, one or two or more elements selected from elements of Groups 4a, 5a, and 6a of the periodic table, B, and Y for the purpose of improving the wear resistance, the heat resistance, or lubricity of the hard coating film. To improve properties of the hard coating film, these elements are elements that are generally added to an AlTiN-based or AlCrN-based hard coating film, and do not significantly lower the durability of the coated cutting tool if content percentages thereof do not become excessive.

However, if the layer c1 contains metal elements other than Al, Cr, and Si at a high content, basic properties as the AlCrN-based hard coating film are damaged, and the durability of the coated cutting tool is lowered. For that reason, the sum of the metal elements other than Al, Cr, and Si in the layer c1 is 25 atom % or less, preferably 20 atom % or less, and more preferably 15 atom % or less.

«Layer c2»

The layer c2 is preferably a nitride or a carbonitride that contains, with respect to the total amount of metal elements (including metalloid elements), at least 55 atom % aluminum (Al) and titanium (Ti) having the second content. Furthermore, the layer c2 is preferably a nitride or a carbonitride that contains, with respect to the total amount of metal elements, at least 55 atom % aluminum (Al) and at least 20 atom % titanium (Ti). The nitride or the carbonitride mainly composed of Al and Ti is a kind of film having excellent wear resistance and heat resistance. Especially, if the content percentage of Al is increased, the heat resistance of the hard coating film tends toward improvement, and the durability of the coated cutting tool is improved. Furthermore, the layer c2 is preferably a nitride having excellent heat resistance and wear resistance. To impart high heat resistance to the hard coating film, the layer c2 contains Al at 55 atom % or more. Furthermore, Al of the layer c2 is preferably 60 atom % or more. However, if the content percentage of Al becomes too high, AlN having an hcp structure increases, and thus the durability of the hard coating film is lowered. For that reason, the content percentage of Al of the layer c2 is preferably 75 atom % or less, and more preferably 70 atom % or less.

If a content percentage of Ti becomes too low, the wear resistance of the nitride or the carbonitride based on Al and Ti is lowered. For that reason, the layer c2 preferably contains Ti at 20 atom % or more. To use the layer c2 as the AlTi-based nitride or carbonitride, the layer c2 contains Ti at the second highest content after Al. However, if the content percentage of Ti becomes too high, the content percentage of Al is relatively lowered, and thus heat resistance is lowered. For that reason, the content percentage of Ti of the layer a is preferably 40 atom % or less, and more preferably 35 atom % or less.

To further enhance the heat resistance and the wear resistance of the layered coating film, the total content percentage of Al and Ti in the layer c2 is preferably 80 atom % or more.

Since the layer c1 and the layer c2 are alternately layered at a nanolevel, mutual compositions are mixed when coated. Further, the mutual compositions can be diffused. For that reason, the layer c2 can contain Cr and Si that are essentially contained in the layer c1. However, to layer an Al-rich AlCrN-based hard coating film and an Al-rich AlTiN-based hard coating film that have different composition systems, a content percentage of Cr of the layer c2 is lower than that of the layer c2. A low content percentage of Si in the layer c1 may not be contained in the layer c2.

The layer c2 can contain metal elements other than Al and Ti. The layer c2 can contain, for instance, one or two or more elements selected from elements of Groups 4a, 5a, and 6a of the periodic table, Si, B, and Y for the purpose of improving the wear resistance, the heat resistance, or the lubricity of the hard coating film. To improve the properties of the hard coating film, these elements are elements that are generally added to the AlTiN-based or AlCrN-based hard coating film, and do not significantly lower the durability of the coated cutting tool if content percentages thereof do not become excessive. Especially, the AlTiN-based hard coating film contains the element tungsten (W), and durability thereof preferably tends to be excellent in a severer usage environment.

However, if the layer c2 contains metal elements other than Al and Ti at a high content, basic properties as the AlTiN-based hard coating film are damaged, and the durability of the coated cutting tool is lowered. For that reason, the sum of the metal elements other than Al and Ti in the layer c2 is 25 atom % or less, preferably 20 atom % or less, and more preferably 15 atom % or less.

To further enhance adhesion between the layer b that is the underlaid layer and the layer c that is the layered coating film, the hard coating film of the same composition system as the layer b is preferably a thicker film at a portion of the layer c which is located close to the layer b. To be specific, if the layer b is an AlTiN-based hard coating film, the layer c1 is preferably a film thicker than the layer c2 at a portion of the layer c which is located close to the layer b. Further, if the layer b is an AlCrN-based hard coating film, the layer c2 is preferably a film thicker than the layer c1 at a portion of the layer c which is located close to the layer b. This coating film structure tends to enhance the adhesion between the layer b that is the underlaid layer and the layer c that is the layered coating film, and the durability of the coated cutting tool may be further improved depending on a tool shape or a usage environment.

In the present embodiment, the layer c is preferably a thickest film with respect to the total thickness of the hard coating film. Since the layer c is a main layer of the hard coating film, the adhesion and the wear resistance are made compatible at a high level, and the durability of the coated cutting tool is improved.

Optimum thicknesses of the layers vary according to a type of the tool, a diameter of the tool, and a material to be cut, but in any case, the layer c becomes the thickest film, and thereby excellent durability is easily realized. In a case where the total thickness of the layer b, the layer c, and the layer d is defined as 100%, a thickness ratio of the layer c is preferably 50% or more, more preferably 60% or more, and most preferably 70% or more. However, if the thickness ratio of the layer c becomes too large, the thicknesses of the layer b and the layer d become small, and thus the adhesion and the wear resistance are reduced. For that reason, the thickness ratio of the layer c is preferably 90% or less, and more preferably 85% or less.

A thickness ratio of the layer b is preferably 5% or more. A thickness ratio of the layer d is preferably 10% or more.

To enhance the adhesion of the layered coating film, thicknesses of the layer c1 and the layer c2 are preferably 20 nm or less. Further, if the thicknesses of the layer c1 and the layer c2 are excessively small, it is difficult to form the layered coating film having different composition systems, and thus the thicknesses of the layer c1 and the layer c2 are preferably 2 nm or more. Furthermore, the thicknesses of the layer c1 and the layer c2 are preferably 5 nm or more. Upper and lower limit values of the thickness of the layer c1 and upper and lower limit values of the thickness of the layer c2 can be appropriately combined.

«Layer d»

The layer d according to the present embodiment is a high hardness layer that is provided on an upper layer of the layer c that is the layered coating film and is harder than the layer c. Hardness of the layer c in the present embodiment is not particularly limited, but nano-indentation hardness of the layer c falls within a range of about 35 to 40 GPa. Wear of the layer c that is a main layer is curbed by providing the high hardness layer d on the upper layer of the layer c, and the durability of the coated cutting tool is further improved. If the layer d is harder than the layer c, the layer d can produce a fixed effect as a protective coating film for the layer c. A coating film composition of the layer d in the present embodiment is not particularly limited. Nano-indentation hardness of the layer d in the present embodiment is set to 40 GPa or higher, which is preferred because it further improves the durability of the coated cutting tool. The layered coating film of the layer d and the layer c may be provided between the layer d and the layer c.

The layer d is preferably a nitride or a carbonitride that contains, as a content percentage of a metal element, at least 70 atom % Ti, and at least 5 atom % silicon (Si). Since the layer d is a hard coating film formed of a TiSiN-based nitride, it is easy for the nano-indentation hardness of the layer d to become hardness higher than 40 GPa. Furthermore, the nano-indentation hardness of the layer d is preferably 42 GPa or higher. Further, in the TiSiN-based hard coating film, a structure of the hard coating film is made fine, and the hard coating film comes to have high hardness. The TiSiN-based hard coating film also has excellent heat resistance, and high residual compressive stress is also imparted to the TiSiN-based hard coating film. For that reason, the TiSiN-based layer d is provided on the upper layer of the layered coating film, and thereby the durability of the coated cutting tool can be remarkably improved in a high-load usage environment. However, if a content percentage of Ti becomes too high, a content percentage of Si is relatively lowered, which causes a coating film structure to become coarse and prevents sufficient residual compressive stress from being imparted to the hard coating film. For that reason, the content percentage of Ti of the layer d is preferably 95 atom % or less. Further, if the content percentage of Si becomes too high, amorphous phases contained in the hard coating film are increased, and the durability of the coated cutting tool is easily lowered. For that reason, the content percentage of Si of the layer d is preferably 30 atom % or less. To further enhance the heat resistance and the wear resistance of the hard coating film, the total content percentage of Ti and Si of the layer d is preferably set to 90 atom % or more. The layer d is preferably a nitride that is excellent in heat resistance and wear resistance. Further, a separate layer having lower hardness than the layer d may be provided on an upper layer of the layer d as needed.

If the thickness of the layer d becomes too thin, the durability of the hard coating film is easily lowered. On the other hand, if the thickness of the layer d becomes too thick, chipping of the hard coating film easily occurs. In order for the coated cutting tool to realize more excellent durability, the thickness of the layer d is preferably 0.1 μm or more and 5.0 μm or less. Furthermore, the thickness of the layer d is preferably 0.2 μm or more. Furthermore, the thickness of the layer d is preferably 3.0 μm or less. Upper and lower limit values of the thickness of the layer d can be appropriately combined.

The layer b, the layer c, and the layer d of the hard coating film according to the present embodiment are nitrides that are excellent in heat resistance and wear resistance. Since the entire hard coating film is a nitride, the durability of the coated cutting tool is further improved. Even if the hard coating film is generally a nitride, the hard coating film contains minute amounts of oxygen and carbon. That is, a metal nitride has a peak intensity in which a metal element and oxygen or carbon are bonded in a microanalysis. If the hard coating film according to the present embodiment is mainly composed of a nitride, a carbonitride or an oxynitride may be contained in some of the nitride. If there is a range in which the aforementioned composition and coating film structure are satisfied, even if a carbonitride or an oxynitride is contained in some of the nitride of which the hard coating film is composed, the durability of the coated cutting tool is not remarkably lowered. Even in a case where the hard coating film according to the present embodiment is composed of a carbonitride, a content percentage of nitrogen is preferably higher than that of carbon to further enhance the heat resistance and the wear resistance of the hard coating film. Even in the case where the hard coating film is composed of a carbonitride, the content percentage of carbon with respect to the content percentage of nitrogen is preferably 20 atom % or less, and more preferably 10 atom % or less.

«Layer a»

In the present embodiment, a layer a in which a nano-beam diffraction pattern is indexed in a crystal structure of WC may be provided between the substrate and the underlaid layer b as needed. The layer a is formed on a surface of the substrate by a metal ion bombardment. Since the layer a is a layer formed by diffusion of metal elements used for the metal ion bombardment, in a case where a WC—Co-based superhard alloy is used as the substrate, the substrate contains, with respect to the total amount of the metal elements, tungsten (W) at a most amount, and metal elements used for the metal ion bombardment at the next amount. Since the hard coating film has the layer a, adhesion between the substrate and the underlaid layer provided thereupon tends to be remarkably improved.

However, if a diameter of the tool is reduced, a cutting edge may be damaged by fusion resulting from a metal ion bombardment in a square end mill or a radius end mill in which the cutting edge easily becomes an acute angle, and a ridge line of the cutting edge is easily broken. For that reason, the layer a is preferably provided for a ball end mill in which the ridge line of the cutting edge is not easily broken by a metal ion bombardment and a sharp cutting edge is not formed. In a case where a thickness of the layer a is too thin or thick, an effect of improving the adhesion is not obtained. For that reason, the thickness of the layer a is preferably 1 nm or more and 10 nm or less.

Since the layer a is the layer in which the nano-beam diffraction pattern is indexed in the crystal structure of WC, the layer a is mainly composed of a carbide. If the layer a is the layer in which the nano-beam diffraction pattern is indexed in the crystal structure of WC, nitrogen or oxygen may be contained in part of the layer a. Further, the layer a may partly contain a metal layer. Especially, a metal ion bombardment treatment using an alloy target that is mainly composed of metal Ti or Ti has a great effect of improving adhesion. For that reason, the layer a preferably contains, as a content percentage of a metal element, Ti at the second highest content percentage after W. However, if the content percentage of Ti contained in the layer a becomes too high or low, an effect of improving adhesion is not easily obtained. The layer a preferably contains Ti at 10 atom % or more and 30 atom % or less.

«Producing Method»

The hard coating film according to the present embodiment is preferably coated by an arc ion plating method having a high ionization rate of a target. Further, the hard coating film is preferably coated by a high power sputtering method having a high ionization rate of a target. To enhance crystallinity in an Al-rich layered coating film to reduce AlN having an hcp structure contained in a microstructure, cathodes in which a magnetic flux density around the center of a target in a vertical direction is 10 mT or more are preferably used.

Further, in cathodes for forming an AlCr-based hard coating film, the film is preferably formed in a range in which cathode voltages are 20 V or higher and 35 V or lower. If the cathode voltages are excessively low, AlN having an hcp structure in the layered coating film is increased, and durability is lowered. Further, if the cathode voltages become too high, a coating film structure of the layered coating film becomes too coarse, and durability is easily lowered. In cathodes for forming an AlTi-based hard coating film, the film is preferably formed in a range in which cathode voltages are 20 V or higher and 30 V or lower. If the cathode voltages become too low, AlN having an hcp structure is increased, and durability is lowered. Further, if the cathode voltages become too high, the coating film structure of the layered coating film becomes too coarse, and the durability is easily lowered. Each cathode current is preferably 120 A or higher and 200 A or lower.

In the producing method of the present embodiment, after a film forming apparatus in which a magnetic flux density around the center of a target in a vertical direction and a cathode voltage become the aforementioned ranges is selected, an absolute value of a negative bias voltage applied to the substrate is preferably increased. According to the producing method, generation of AlN having an hcp structure in the microstructure can be curbed, and a value of $Ih \times 100/Is$ can be made smaller than 15.

The negative bias voltage applied to the substrate is preferably −200 V or higher and lower than −100 V. Furthermore, the negative bias voltage is preferably −120 V or lower. If the absolute value of the bias voltage becomes too large, film formation is hardly stabilized, and it is difficult to adjust a film thickness. Further, if the absolute value of the bias voltage becomes too small, AlN having an hcp structure is increased, and the durability is lowered. A coating temperature is preferably 400° C. or higher and 600° C. or lower. In a case where a nitride is coated, the nitride is coated by introducing a nitrogen gas into a furnace. Further, a pressure of the nitrogen gas during coating is preferably 2.0 Pa or higher and 8.0 Pa or lower. In a case where a carbonitride is coated, some of the nitrogen gas may be substituted with a methane gas.

First Examples

<Film Forming Apparatus>

A film forming apparatus using an arc ion plating method was used for film formation. The film forming apparatus included a plurality of cathodes (arc evaporation sources), a vacuum container, and a substrate rotating mechanism. Among the cathodes, one cathode (hereinafter referred to as "C1"), in which a coil magnet is disposed around a target, and three cathodes (hereinafter referred to as "C2, C3, and C4"), in which a permanent magnet is disposed on the back and outer circumference of the target, which has a vertical magnetic flux density on a surface of the target, and in which the vertical magnetic flux density is 14 mT around the center of the target, are mounted.

C1 to C4 are disposed around a region in which the substrate is disposed at intervals of about 90°, and C1 and C4, and C2 and C3 are provided to face each other.

The vacuum container was exhausted from inside by a vacuum pump, and allowed a gas to be introduced from a supply port. Bias power supplies were connected to the substrates installed in the vacuum container, and negative DC bias voltages could be independently applied to the substrates.

The substrate rotating mechanism included a planetary, a plate-like jig disposed on the planetary, and pipe-like jigs disposed on the plate-like jig. The planetary was turned at a speed of 3 revolutions per minute, and the plate-like jig and the pipe-like jigs were made to be rotated and revolved.

In First Examples, the following square end mill was used for the substrates.

Composition: WC (bal.), Co (8 mass %), Cr (0.5 mass %), and V (0.3 mass %)

Hardness: 94.0 HRA

Flute diameter: 6 mm

Number of flutes: six

In First Examples, a metal titanium target, an AlTi-based alloy target, an AlCrSi-based alloy target, and a TiSi-based alloy target were installed on C1, C2, C3, and C4, respectively.

The substrates were fixed to the pipe-like jigs in the vacuum container, and the following processes were performed before film formation. First, the vacuum container was evacuated at $5 \times 10^{-2}$ Pa or lower. Afterward, the substrates were heated up to a temperature of 500° C. by a heater installed in the vacuum container, and evacuation was performed. A setting temperature for the substrates was set to 500° C., and a pressure inside the vacuum container was set to $5 \times 10^{-2}$ Pa or lower.

<Ar Bombardment>

Afterward, an argon (Ar) gas of 50 sccm was introduced into the vacuum container under flow control. In this case, the pressure inside the vacuum container was about 0.5 Pa. Next, a bias voltage of −200 V was applied to the substrates while discharging Ti by supplying a current of 200 A to C1 in a state in which a space between the substrates and C1 was blocked, and an Ar bombardment was performed for 30 minutes. Oxygen in a furnace was reduced by this Ar bombardment treatment.

<Film Forming Process>

Afterward, the setting temperature for the substrates was set to 480° C., and a pressure in the furnace was set to 3.2 Pa by introducing a nitrogen gas into the vacuum container.

In coating of the layer b in any samples, the negative bias voltage applied to the substrates was set to −120 V, and a current applied to C2 was set to 200 A. Further, in coating of the layer d in any samples, the negative bias voltage applied to the substrates was set to −40 V, and a current applied to C4 was set to 200 A.

In coating of the layer c, the negative bias voltage applied to the substrates was changed according to the sample. Further, power supplied to C2 was fixed, power supplied to C3 was gradually increased, and a portion of the layer c which was close to the layer b was coated such that the layer c2 (AlTiN-based) become a film thicker than the layer c1 (AlCrN-based). During coating, a cathode voltage of C2 was 20 V or higher and 30 V or lower, and a cathode voltage of C3 was 20 V or higher and 35 V or lower.

Compositions of targets used are shown in Table 1. Conditions of film formation are shown in Table 2. Film thicknesses of samples are shown in Table 3.

TABLE 1

| Sample No. | C1 (atom %) | C2 (atom %) | C3 (atom %) | C4 (atom %) |
|---|---|---|---|---|
| Example 1 | Ti100 | Al70Ti25W5 | Al60Cr37Si3 | Ti75Si25 |
| Example 2 | Ti100 | Al67Ti33 | Al60Cr37Si3 | Ti75Si25 |
| Example 3 | Ti100 | Al70Ti25W5 | Al60Cr37Si3 | Ti75Si25 |
| Example 4 | Ti100 | Al70Ti25W5 | Al60Cr37Si3 | Ti73Si23Cr4 |
| Comparative Example 1 | Ti100 | Al70Ti25W5 | Al60Cr37Si3 | Ti75Si25 |
| Comparative Example 2 | Ti100 | Al70Ti25W5 | Al60Cr37Si3 | Ti75Si25 |
| Comparative Example 3 | Ti100 | Al70Ti25W5 | Al60Cr37Si3 | Ti75Si25 |
| Comparative Example 4 | Ti100 | Al55Ti45 | Al60Cr37Si3 | Ti75Si25 |

TABLE 2

| | Layer c1 | | Layer c2 | |
|---|---|---|---|---|
| Sample No. | Bias voltage (V) | Current (A) | Bias voltage (V) | Current (A) |
| Example 1 | −120 | 200 | −120 | 135 → 200 |
| Example 2 | −120 | 200 | −120 | 135 → 200 |
| Example 3 | −100 | 200 | −100 | 135 → 200 |
| Example 4 | −120 | 200 | −120 | 135 → 200 |
| Comparative Example 1 | −75 | 200 | −75 | 135 → 200 |
| Comparative Example 2 | −75 | 200 | −75 | 135 → 200 |
| Comparative Example 3 | −75 | 200 | −75 | 135 → 200 |
| Comparative Example 4 | −75 | 200 | −75 | 135 → 200 |

TABLE 3

| | Thickness (μm) | | |
|---|---|---|---|
| Sample No. | Layer b | Layer c | Layer d |
| Example 1 | 2 | 2 | 0.8 |
| Example 2 | 2.2 | 1.8 | 0.7 |
| Example 3 | 2.1 | 2 | 0.7 |
| Example 4 | 2 | 2.2 | 0.7 |
| Comparative Example 1 | 2 | 1.8 | 0.8 |
| Comparative Example 2 | 2.1 | 1.9 | 0.8 |
| Comparative Example 3 | 0.5 | 3.8 | 0.5 |
| Comparative Example 4 | 2.1 | 2 | 0.9 |

A cutting test was performed on the made coated cutting tool in cutting conditions shown below.

A commercially available solid end mill widely used in cutting machining of a high hardness material in a market was also evaluated. Commercial Product 1 was a coating film structure in which $Al_{60}Cr_{25}Ti_{15}N$ (where numerical values were an atomic ratio; the same applies below) was provided on a surface of the substrate by about 2 μm, $Ti_{80}Si_{20}N$ was provided thereon by about 2 μm, and $Al_{60}Cr_{25}Ti_{15}N$ was provided on an outermost layer by about 0.5 μm. Commercial Product 2 was a coating film structure in which $Al_{50}Ti_{35}Cr_{15}N$ was provided on a surface of the substrate by about 3 μm, and $Cr_{55}Al_{35}Si_{10}N$ was provided thereon by about 1 μm.

Results of the cutting test are shown in Table 4. Details of the cutting conditions are as follows.

<Machining Condition A>

Cutting method: Side cutting

Workpiece: STAVAX (52 HRC)

Tool for use: 6-flute square end mill (tool diameter of 6 mm)

Depth of cut: 6.0 mm in the axial direction, and 0.1 mm in the radial direction

Cutting speed: 70 m/min

Feed rate of one flute: 0.026 mm/flute

Coolant: Dry machining (air blow)

Cutting distance: 40 m

<Machining Condition B>

Cutting method: Side cutting

Workpiece: STAVAX (52 HRC)

Tool for use: 6-flute square end mill (tool diameter of 6 mm)

Depth of cut: 6.0 mm in the axial direction, and 0.3 mm in the radial direction

Cutting speed: 70 m/min

Feed rate of one flute: 0.026 mm/flute

Coolant: Dry machining (air blow)

Cutting distance: 40 m

TABLE 4

| Sample No. | Condition A Low depth of cut | Condition A High depth of cut |
|---|---|---|
| Example 1 | Stable wear (maximum wear width of 0.03 mm) | Stable wear (maximum wear width of 0.03 mm) |
| Example 2 | Stable wear (maximum wear width of 0.03 mm) | Stable wear (maximum wear width of 0.04 mm) |
| Example 3 | Stable wear (maximum wear width of 0.03 mm) | Stable wear (maximum wear width of 0.04 mm) |
| Example 4 | Stable wear (maximum wear width of 0.03 mm) | Stable wear (maximum wear width of 0.03 mm) |

TABLE 4-continued

| Sample No. | Condition A Low depth of cut | Condition A High depth of cut |
|---|---|---|
| Comparative Example 1 | Stable wear (maximum wear width of 0.04 mm) | Chipping generated at 20 m |
| Comparative Example 2 | Stable wear (maximum wear width of 0.04 mm) | Chipping generated at 20 m |
| Comparative Example 3 | Stable wear (maximum wear width of 0.03 mm) | Chipping generated at 20 m |
| Comparative Example 4 | Stable wear (maximum wear width of 0.06 mm) | Chipping generated at 20 m |
| Commercial Product 1 | Chipping generated at 40 m | Chipping generated at 20 m |
| Commercial Product 2 | Stable wear (maximum wear width of 0.07 mm) | Stable wear (maximum wear width of 0.06 mm) |

Examples 1 to 4 were in a state in which a maximum wear width was small in either machining condition, a stable wear form was exhibited, and continuous cutting machining was possible. If Examples 1 and 2 were compared, Example 1 in which W was contained in the layer c2 showed a tendency of the maximum wear width to be further curbed in the machining condition of the high depth of cut. Further, if Examples 1 and 3 were compared, Example 1 in which the absolute value of the negative bias voltage applied to the substrates was great showed a tendency of the maximum wear width to be further curbed in the machining condition of the high depth of cut.

Comparative Examples 1 to 3 had the same coating film composition as in Example 1, and were in a state in which, in the machining condition of the low depth of cut, a maximum wear width was small as in the present examples, and a stable wear form was exhibited. However, in the machining condition of the high depth of cut, chips were generated in Comparative Examples 1 to 3, and continuous cutting machining was impossible.

Comparative Example 4 had a composition in which the content percentage of Al of the layered coating film was lower than in Examples 1 to 4, and in the machining condition of the low depth of cut, no chips were generated, but the maximum wear width become greater than in Examples 1 to 4. Further, in the machining condition of the high depth of cut, the coated cutting tool of Comparative Example 4 could not perform the continuous cutting due to generation of chips.

In Commercial Product 1, large chips were generated in either machining condition. Further, in Commercial Product 2, no chips were generated, but the maximum wear width become great in either machining condition, compared to the coated cutting tools of the present examples.

A microanalysis of the layered coating film was performed on Examples 1 to 4 in order to explain a cause of excellent durability in high-load machining conditions.

A composition analysis was performed on the layer b and the layer d by an accessory wavelength dispersive spectrometry electron probe microanalysis (WDS-EPMA) using an electron probe micro-analyzer (model No. JXA-8500F) available from JEOL Ltd., and it was ascertained that the layer b and the layer d were nitrides that were nearly the same as the alloy composition of the target. Further, hardness of the hard coating film was measured using a nano-indentation tester (ENT-2100 available from Elionix Inc.). It was ascertained from the results of the measurement that the hardness of the layer c was about 38 GPa, the hardness of the layer d was about 45 GPa, and the layer d had higher hardness than the layer c.

Figure 2:
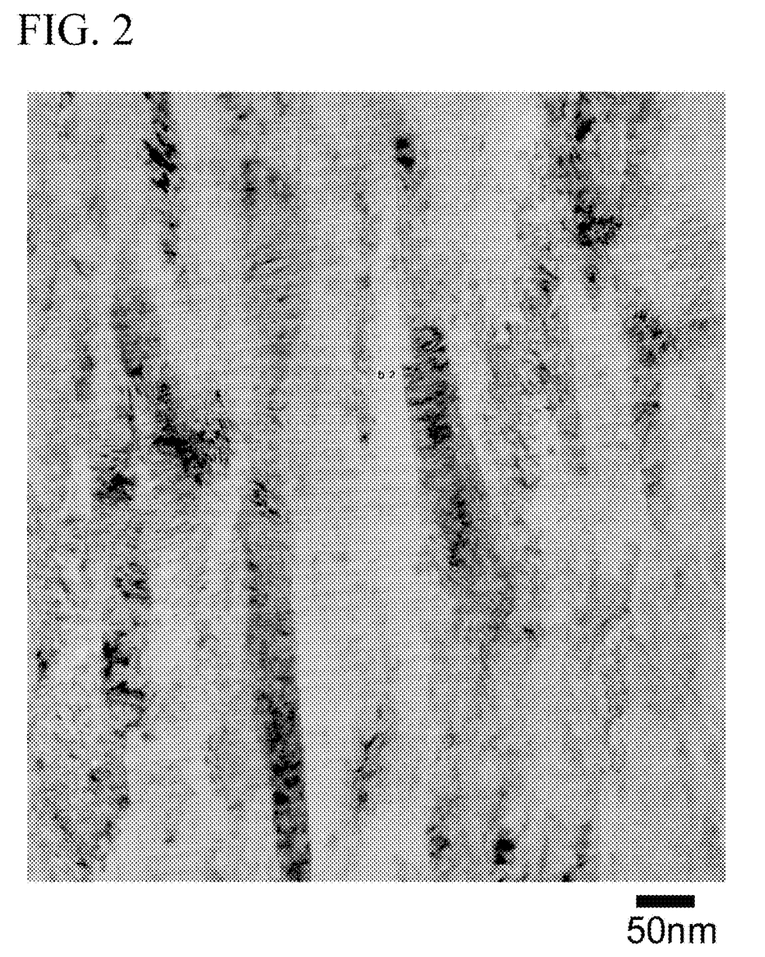
FIG. 2 is an example of a cross-sectional TEM image (at a magnification of 300,000) in a layered coating film of Example 1.
Figure 3:
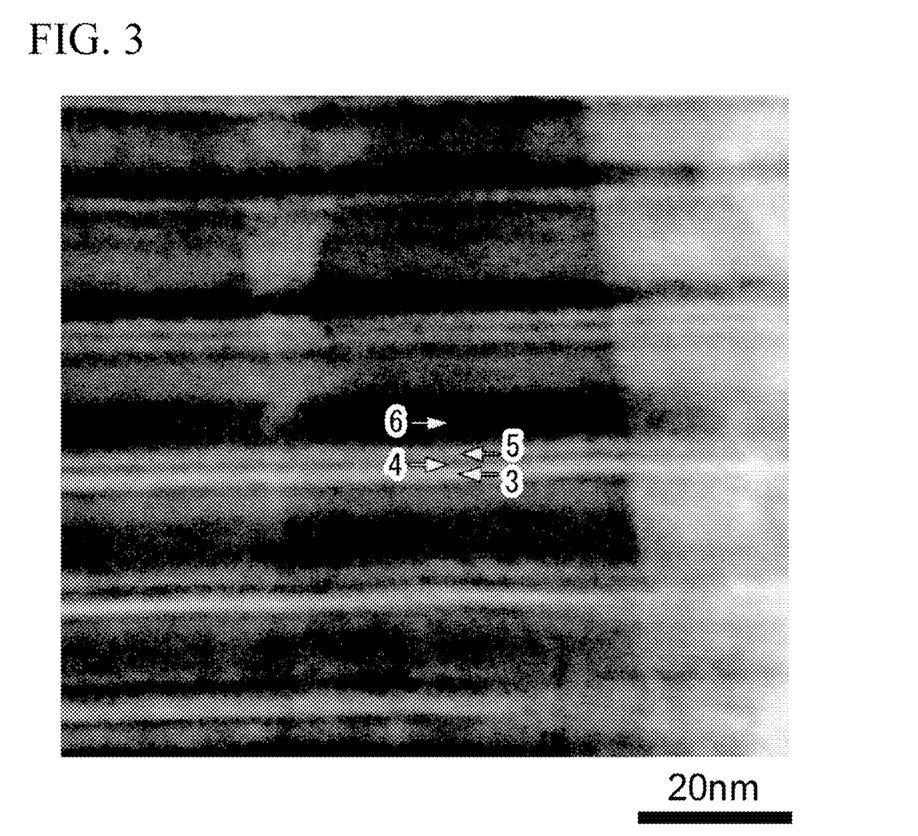
FIG. 3 is an example of a cross-sectional dark field STEM image (at a magnification of 1,800,000) in the layered coating film of Example 1.

As to Examples 1 to 4, a square end mill for evaluating physical properties was machined, and a machined cross section was observed by a transmission electron microscope (TEM). As an example, a cross section TEM image (at a magnification of 300,000) in the layer c (the layered coating film) of Example 1 is illustrated in FIG. 2. It was ascertained from FIG. 2 that the layer c that was the layered coating film was formed of fine columnar particles having an average width of 50 to 70 nm. FIG. 3 is an example of a cross-sectional dark field STEM image (at a magnification of 1,800,000) of the layer c of Example 1. It was ascertained from FIG. 3 that relatively bright portions and relatively dark portions were layered in the layer c. In FIG. 3, the relatively bright portions of arrows 3 to 5 were the Al-rich AlTiN-based nitride (the layer c2), and a relatively dark arrow 6 was the Al-rich AlCrN-based nitride (the layer c1).

The results of the composition analysis of arrows (analysis points) 3 to 6 in FIG. 3 and the entire layered coating film are shown in Table 5. The compositions of the layer c1 and the layer c2 were obtained by setting an analysis region to φ1 nm and analyzing a central portion of each layer using an energy dispersive X-ray spectrometer (EDS). Value below the decimal point were rounded off and obtained.

The layer c of Example 1 was rich in Al in the entire layered coating film, and contained at least Si, Ti, and Cr. In Example 1, the compositions of the layer c1 and the layer c2 were mutually mixed, and the layer c1 contained the sum of Ti and W at 10 atom % or less. Further, the layer c2 of Example 1 contained Cr at 10 atom % or less.

TABLE 5

| | Al (atom %) | Si (atom %) | Ti (atom %) | Cr (atom %) | W (atom %) |
|---|---|---|---|---|---|
| Entire layered coating film | 64 | 2 | 12 | 19 | 3 |
| Analysis point 6 | 65 | 1 | 6 | 27 | 1 |
| Analysis point 5 | 65 | 0 | 25 | 4 | 6 |
| Analysis point 4 | 67 | 0 | 23 | 4 | 6 |
| Analysis point 3 | 62 | t | 24 | 6 | 7 |

Next, a selected area diffraction pattern of the layered coating film was obtained in conditions that an accelerating voltage was 120 kV, a selected area region was φ750 nm, a camera length was 100 cm, and a quantity of incident electrons was 5.0 pA/cm² (on a fluorescent plate). An intensity profile was obtained by converting brightness of the obtained selected area diffraction pattern. A spot for analysis was an intermediate portion in a film thickness direction.

Figure 4:
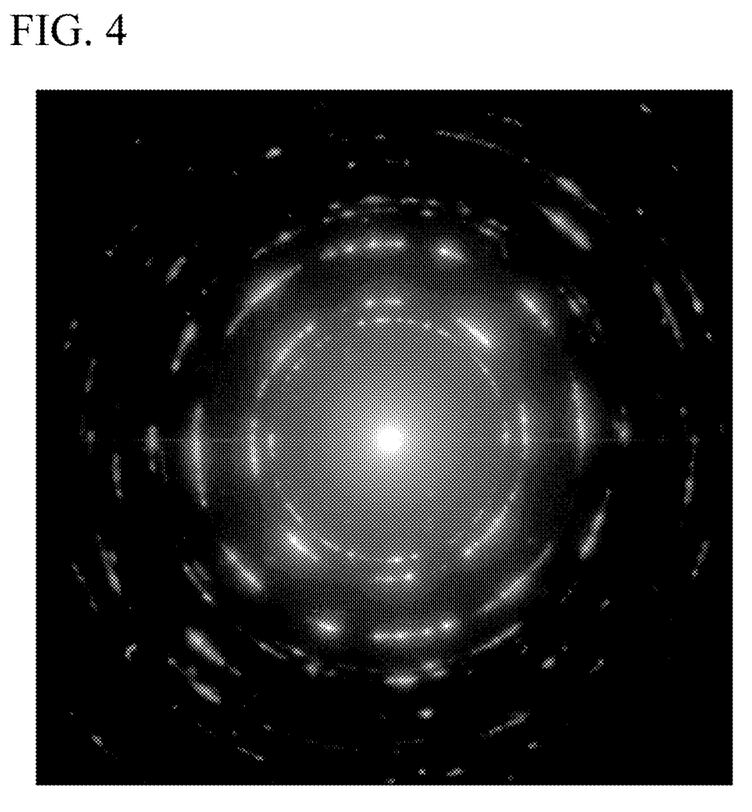
FIG. 4 is an example of a selected area diffraction pattern in the layered coating film of Example 1.
Figure 5:
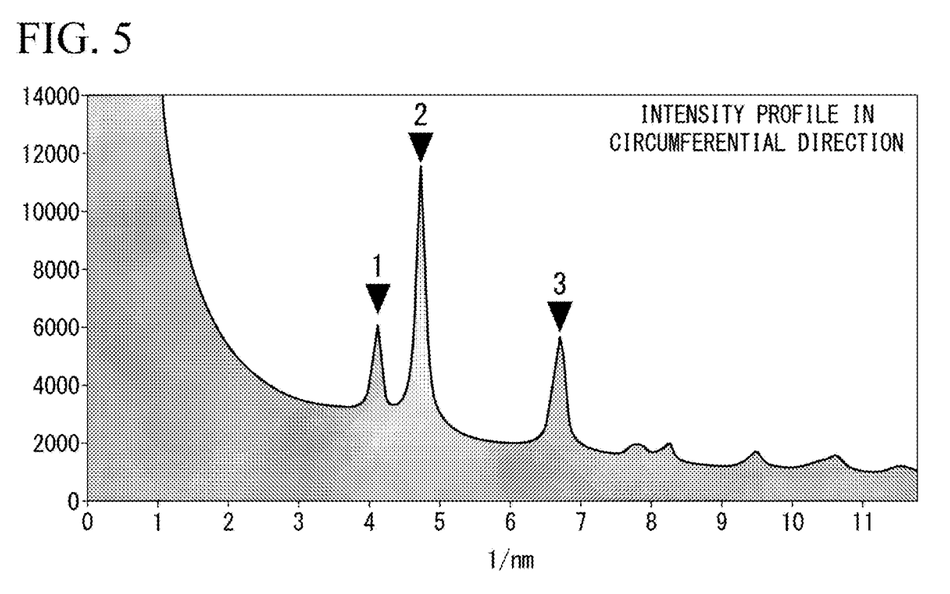
FIG. 5 is an example of an intensity profile obtained from the selected area diffraction pattern of FIG. 4.
Figure 6:
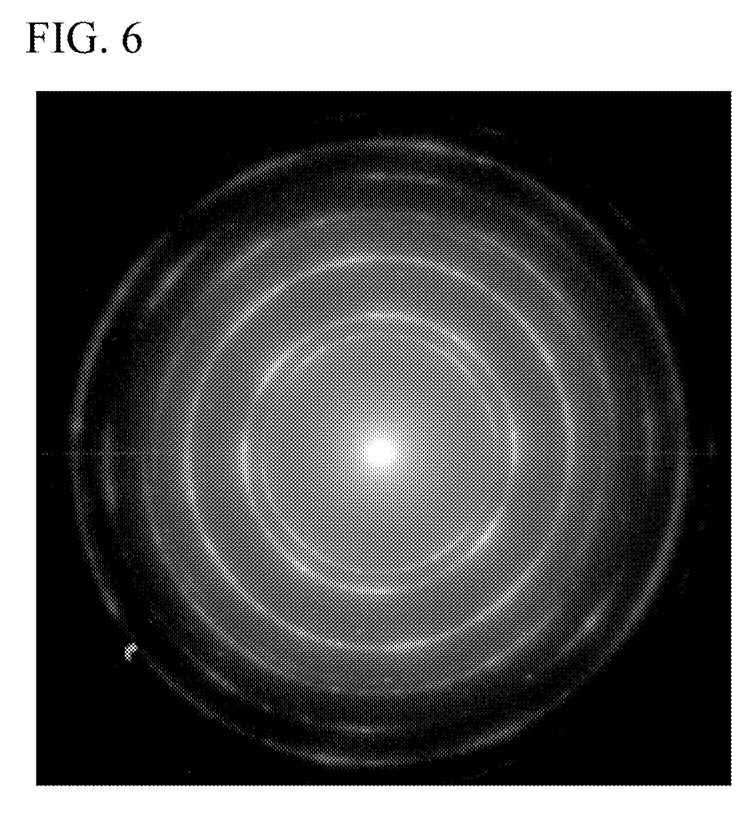
FIG. 6 is an example of a selected area diffraction pattern in a layered coating film of Comparative Example 1.
Figure 7:
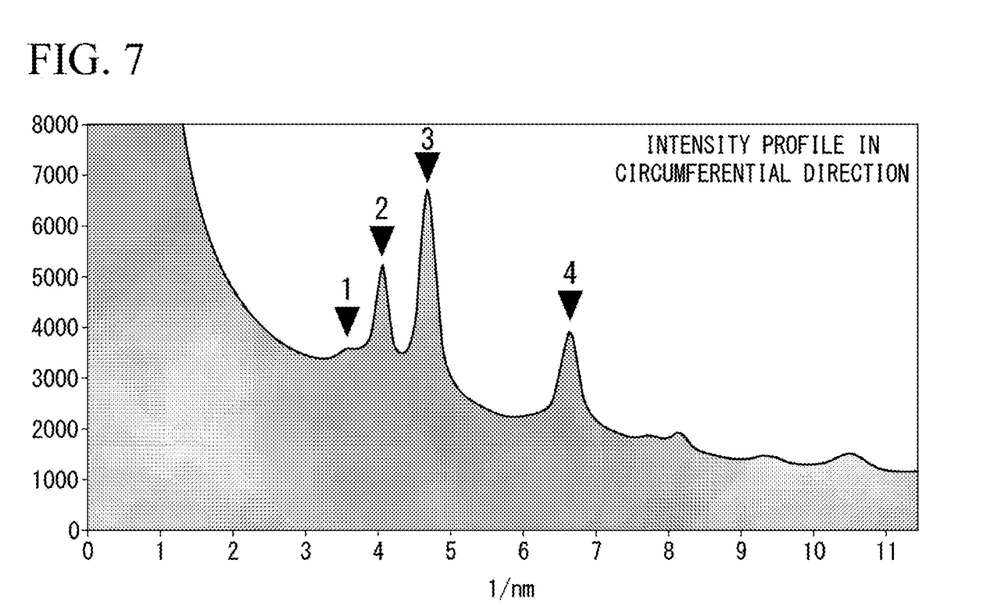
FIG. 7 is an example of an intensity profile obtained from the selected area diffraction pattern of FIG. 6.

An example of the selected area diffraction pattern of the layer c in Example 1 is illustrated in FIG. 4. An example of the selected area diffraction pattern of the layer c in Comparative Example 1 in which coating conditions of the layered coating film are different is illustrated in FIG. 6. Further, an example of the intensity profile of the selected area diffraction pattern which is obtained by converting the brightness of the selected area diffraction pattern of the layered coating film in FIGS. 4 and 6 is illustrated in FIGS. 5 and 7. In FIGS. 5 and 7, the horizontal axis shows distances (radii r) from a spot center of a (000) plane, and the vertical axis shows an intensity (in an arbitrary unit) integrated by one round of a circle in each of the radii r.

In FIG. 5, an arrow 1 is a peak ascribable to a (111) plane of AlN, a (111) plane of TiN, and a (111) plane of CrN which have fcc structures. An arrow 2 is a peak ascribable to a (200) plane of AlN, a (111) plane of TiN, and a (200) plane of CrN which have fcc structures. An arrow 3 is a peak ascribable to a (220) plane of AlN, a (111) plane of TiN, and a (220) plane of CrN which have fcc structures. In FIG. 5, a peak intensity ascribable to AlN having an hcp structure is not checked. On the other hand, an arrow 1 of FIG. 7 is a peak ascribable to a (010) of AlN having an hcp structure, and a maximum intensity of AlN having an hcp structure.

As illustrated in FIG. 5, the peak ascribable to the (010) of AlN having an hcp structure was not checked in Example 1, and Ih×100/Is is 0. On the other hand, Ih×100/Is was 19 in Comparative Example 1.

Ih×100/Is of the layered coating film was 0 in any of Examples 1 to 4. Further, Ih×100/Is in Comparative Examples 2 to 4 was nearly the same as in Comparative Example 1. As to Examples 1, 2, and 4 in which the negative bias voltage applied to the substrate was se to −120 V, the peak ascribable to the (010) of AlN was not checked in the selected area diffraction pattern. On the other hand, as to Example 3 in which the negative bias voltage applied to the substrate was se to −100 V, the peak ascribable to the (010) of AlN was checked in the selected area diffraction pattern at a minute amount, but a value of Ih×100/Is become 0 because an amount of the peak was the minute amount.

As to Examples 1 to 4 and Comparative Examples 1 to 4, the peak intensity ascribable to AlN having an hcp structure was not checked by X-ray diffraction, but there was a difference in the peak intensity ascribable to AlN having an hcp structure in the selected area diffraction pattern. Examples 1 to 4 were estimated that the durability was remarkably improved in a high-load machining condition because AlN having an hcp structure contained in the microstructure was small. Especially, Examples 1, 2, and 4 in which the peak ascribable to the (010) of AlN having an hcp structure was not checked in the selected area diffraction pattern showed a tendency of a damaged state of the tool to be stabilized.

Second Examples

In Second Examples, a thickness of the layered coating film was evaluated. Examples 20 and 21 had the same composition as Example 1, and only a film thickness was changed by adjusting a coating time.

A cutting test was performed on the coated cutting tool that was made in cutting conditions shown below. Results of the cutting test are shown in Table 6. Details of the cutting conditions are as follows.

<Machining Condition C>
Cutting method: Bottom cutting
Workpiece: STAVAX (52 HRC)
Tool for use: 4-flute square end mill (tool diameter of 6 mm)
Depth of cut: 6.0 mm in the axial direction, and 0.1 mm in the radial direction
Cutting speed: 70 m/min
Feed rate of one flute: 0.04 mm/flute
Coolant: Dry machining (air blow)
Cutting distance: 40 m

TABLE 6

| Sample No. | Thickness (μm) | | | Condition C |
| | Layer b | Layer c | Layer d | |
|---|---|---|---|---|
| Example 20 | 1.9 | 1.8 | 0.9 | Stable wear (maximum wear width of 0.03 mm) |
| Example 21 | 0.6 | 3.5 | 0.5 | Stable wear (maximum wear width of 0.02 mm) |

In any of Examples 20 and 21, Ih×100/Is of the layered coating film was 0, a maximum wear width was small, and a stable wear form was exhibited. Especially, it was ascertained in Example 21 that the maximum wear width was further curbed, and more excellent durability was exhibited by forming the layer c into a thickest film.

Third Examples

In Third Examples, the following ball end mill was used for the substrates.

Composition: WC (bal.), Co (8 mass %), Cr (0.8 mass %), and Ta (0.2 mass %)
Hardness: 93.2 HRA
Flute diameter: 1.0 mm In Third Examples, a metal titanium target, an AlTi-based alloy target or a TiSi-based alloy target, an AlCrSi-based alloy target, and a TiSi-based alloy target were installed on C1, C2, C3, and C4, respectively. Compositions of the targets used are shown in Table 7.

TABLE 7

| Sample No. | C1 (atom %) | C2 (atom %) | C3 (atom %) | C4 (atom %) |
|---|---|---|---|---|
| Example 30 | Ti100 | Al70Ti25W5 | Al60Cr37Si3 | Ti75Si25 |
| Example 31 | Ti100 | Al67Ti33 | Al60Cr37Si3 | Ti75Si25 |
| Example 32 | Ti100 | Al70Ti25W5 | Al60Cr37Si3 | Ti75Si25 |
| Example 33 | Ti100 | Al70Ti25W5 | Al60Cr37Si3 | Ti75Si25 |
| Comparative Example 30 | Ti100 | Al70Ti25W5 | Al60Cr37Si3 | Ti75Si25 |
| Comparative Example 31 | Ti100 | Al70Ti25W5 | Al60Cr37Si3 | Ti75Si25 |
| Comparative Example 32 | Ti100 | Ti75Si25 | Al60Cr37Si3 | Ti75Si25 |

Ar bombardment treatment was the same as in First Examples and Second Examples. Afterward, an argon (Ar) gas of 50 sccm was introduced into the vacuum container under flow control. In this case, a pressure inside the vacuum container was about 0.2 Pa. Next, a negative bias voltage applied to the substrates was set to −800 V, and Ti bombardment treatment was performed for about 15 minutes. Thereby, the layer a was provided on the surfaces of the substrates.

<Film Forming Process>
Afterward, a setting temperature for the substrates was set to 480° C., and a pressure in the furnace was set to 5.0 Pa by introducing a nitrogen gas into the vacuum container.

In coating of the layer b in any samples, the negative bias voltage applied to the substrates was set to −100 V, and a current applied to C2 was set to 200 A. Further, in coating of the layer d in any samples, the negative bias voltage applied to the substrates was set to −50 V, and a current applied to C4 was set to 200 A. In coating of the layer c, the negative bias voltage applied to the substrates was changed according to the sample. Conditions of film formation are shown in Table 8. Film thicknesses of samples are shown in Table 9.

TABLE 8

| Sample No. | Layer c1 | | Layer c2 | |
| --- | --- | --- | --- | --- |
| | Bias voltage (V) | Current (A) | Bias voltage (V) | Current (A) |
| Example 30 | −150 | 200 | −150 | 200 |
| Example 31 | −150 | 200 | −150 | 200 |
| Example 32 | −175 | 200 | −175 | 200 |
| Example 33 | −150 | 200 | −150 | 200 |
| Comparative Example 30 | −75 | 200 | −75 | 200 |
| Comparative Example 31 | −100 | 200 | −100 | 200 |
| Comparative Example 32 | −75 | 200 | −150 | 200 |

TABLE 9

| | Thickness (μm) | | |
| --- | --- | --- | --- |
| Sample No. | Layer b | Layer c | Layer d |
| Example 30 | 1.8 | 2.1 | 0.5 |
| Example 31 | 1.7 | 2.2 | 0.4 |
| Example 32 | 1.7 | 1.6 | 0.3 |
| Example 33 | 0.3 | 2.2 | 1.8 |
| Comparative Example 30 | 1.8 | 2.2 | 0.5 |
| Comparative Example 31 | 1.7 | 2.1 | 0.4 |
| Comparative Example 32 | 1.7 | 2.2 | 0.4 |

A cutting test was performed on the coated cutting tool that was made in cutting conditions shown below. Results of the cutting test are shown in Table 10. Details of the cutting conditions are as follows.

<Machining Condition D>
Cutting method: Bottom cutting
Workpiece: STAVAX (52 HRC)
Tool for use: 2-flute square end mill (tool diameter of 1 mm and under neck length of 6 mm)
Depth of cut: 0.04 mm in the axial direction, and 0.04 mm in the radial direction
Cutting speed: 75 m/min
Feed rate of one flute: 0.018 mm/flute
Coolant: Dry machining
Cutting distance: 90 m

TABLE 10

| Sample No. | Condition D |
| --- | --- |
| Example 30 | Stable wear (maximum wear width of 0.015 mm) |
| Example 31 | Stable wear (maximum wear width of 0.018 mm) |
| Example 32 | Stable wear (maximum wear width of 0.030 mm) |
| Example 33 | Stable wear (maximum wear width of 0.014 mm) |
| Comparative Example 30 | Stable wear (maximum wear width of 0.040 mm) |
| Comparative Example 31 | Stable wear (maximum wear width of 0.035 mm) |
| Comparative Example 32 | Stable wear (maximum wear width of 0.035 mm) |

Examples 30 to 33 were in a state in which a maximum wear width was also small, a stable wear form was exhibited, and continuous cutting was possible. Since Example 32 increased the absolute value of the negative bias voltage applied to the substrates, it was difficult to adjust a film thickness, and the thickness of the layer c become thinner than in Examples 30, 31, and 33. For that reason, in comparison with Examples 30, 31, and 33, the maximum wear width was increased. If Examples 30 and 31 are compared, Example 30 in which W was contained in the layer c2 showed a tendency of the maximum wear width to be further curbed.

On the other hand, Comparative Examples 30 to 32 exhibited a stable wear form, but a maximum wear width was increased compared to Examples 30 to 33.

A ball end mill for evaluating physical properties was machined, and a microanalysis was performed. The layer a in which a nano-beam diffraction pattern is indexed in a crystal structure of WC, which contained Ti at the second highest content after W among the metal elements, and which had a thickness of 1 to 10 nm was provided between the substrate and the layer b. The layer a contained Ti at 10 atom % or more and 30 atom % or less. Further, the layer a also slightly contained substrate components as inevitable impurities other than oxygen, nitrogen, W.

It was ascertained that the layer b and the layer d were nitrides having nearly the same as the alloy composition of the target as in First Examples and Second Examples.

Like the microanalysis of First Examples, the layered coating film for Examples 30, 31, 32, and 33 had a structure in which the Al-rich AlTi-based nitride (the layer c2) and the Al-rich AlCrSi-based nitride (the layer c1) were layered, and Ih×100/Is was 0. That is, even in Examples 30 to 33, AlN having an hcp structure was reduced. Thus, it was estimated that excellent durability was produced even in a ball end mill. On the other hand, the layered coating film for Comparative Examples 30 and 31 was estimated that, since Ih×100/Is was about 20 and AlN having a brittle hcp structure was increased in a microstructure, the durability is lowered compared to the present examples. Further, Comparative Example 32 was different in composition of the layered coating film from the present examples, and has an increased maximum wear width compared to the present examples.

It was ascertained from the comparison between Comparative Examples 30 to 32 and Example 32 that, if AlN having an hcp structure was increased although the layer c was formed into the thickest film, the maximum wear width was increased. AlN having an hcp structure was reduced in the microstructure although the layer c was not formed into the thickest film, and thereby the maximum wear width could be curbed. The layer c was formed into the thickest film, and AlN having an hcp structure was reduced in the microstructure. Thereby, it was ascertained that an effect of curbing the maximum wear width was increased, and especially excellent durability was produced.

The invention claimed is:
1. A coated cutting tool comprising a substrate and a hard coating film formed on the substrate, wherein the hard coating film has:
a layer (b) disposed on the substrate and composed of a nitride or a carbonitride; and
a layer (c) disposed on the layer (b) and which is a layered coating film made by alternately layering
a nitride or carbonitride layer (c1) and configured to contain, with respect to a total amount of metal elements (including metalloid elements), at least 55 atom % to at most 75 atom % aluminum (Al), chromium (Cr) having a second highest content percentage, and at least silicon (Si), and
a nitride or carbonitride layer (c2) including, with respect to the total amount of metal elements (including metalloid elements), at least 55 atom % to at most 75 atom % aluminum (Al), and titanium (Ti) having a second highest content, each layer having a thickness of 50 nm or less; and
a layer (d) disposed on the layer (c) and having higher hardness than the layer (c), and
in a case where, in an intensity profile obtained from a selected area diffraction pattern of a transmission electron microscope, a peak intensity ascribable to a (010) plane of AlN having a hexagonal closest packed structure is defined as Ih, and a sum total of a peak intensity ascribable to a (111) plane of AlN, a (111) plane of TiN, a (111) plane of CrN, a (200) plane of AlN, a (200) plane of TiN, a (200) plane of CrN, a (220) plane of AlN, a (220) plane of TiN, and a (220) plane of CrN, all of which have face-centered cubic structures, and a peak intensity ascribable to a (010) plane of AlN, a (011) plane of AlN, and a (110) plane of AlN, all of which have hexagonal closest packed structures, is defined as Is, the layer (c) satisfies a relationship of Ih×100/Is≤15.

2. The coated cutting tool according to claim 1, wherein:
the layer (c1) is a nitride or a carbonitride that contains, with respect to the total amount of metal elements (including metalloid elements), at least 55 atom % aluminum (Al), at least 20 atom % chromium (Cr), and at least 1 atom % silicon (Si); and
the layer (c2) is a nitride or a carbonitride that contains, with respect to the total amount of metal elements (including metalloid elements), at least 55 atom % aluminum (Al) and at least 20 atom % titanium (Ti).

3. The coated cutting tool according to claim 1, wherein the layer (c) satisfies a relationship of Ih×100/Is=0.

4. The coated cutting tool according to claim 1, wherein, with respect to a total thickness of the hard coating film, the layer (c) is a thickest film.

5. The coated cutting tool according to claim 1, wherein the layer (c) is composed of columnar particles, and an average width of the columnar particles is 90 nm or less.

6. The coated cutting tool according to claim 1, wherein the layer (d) is a nitride or a carbonitride that contains, with respect to the total amount of metal elements (including metalloid elements), at least 70 atom % titanium (Ti) and at least 5 atom % silicon (Si).

7. The coated cutting tool according to claim 1, wherein the layer (c2) contains one or two or more elements selected from elements of Groups 4a, 5a, and 6a of the periodic table, and Si, B, and Y.

8. The coated cutting tool according to claim 1, wherein a layer (a) in which a nano-beam diffraction pattern is indexed in a crystal structure of WC and whose thickness is 1 nm or more and 10 nm or less is provided between the substrate and the layer (b).

9. The coated cutting tool according to claim 2, wherein the layer (c) satisfies a relationship of Ih×100/Is=0.

10. The coated cutting tool according to claim 2, wherein, with respect to a total thickness of the hard coating film, the layer (c) is a thickest film.

11. The coated cutting tool according to claim 3, wherein, with respect to a total thickness of the hard coating film, the layer (c) is a thickest film.

12. The coated cutting tool according to claim 2, wherein the layer (c) is composed of columnar particles, and an average width of the columnar particles is 90 nm or less.

13. The coated cutting tool according to claim 3, wherein the layer (c) is composed of columnar particles, and an average width of the columnar particles is 90 nm or less.

14. The coated cutting tool according to claim 4, wherein the layer (c) is composed of columnar particles, and an average width of the columnar particles is 90 nm or less.

15. The coated cutting tool according to claim 2, wherein the layer (d) is a nitride or a carbonitride that contains, with respect to the total amount of metal elements (including metalloid elements), at least 70 atom % titanium (Ti) and at least 5 atom % silicon (Si).

16. The coated cutting tool according to claim 3, wherein the layer (d) is a nitride or a carbonitride that contains, with respect to the total amount of metal elements (including metalloid elements), at least 70 atom % titanium (Ti) and at least 5 atom % silicon (Si).

17. The coated cutting tool according to claim 2, wherein the layer (c2) contains one or two or more elements selected from elements of Groups 4a, 5a, and 6a of the periodic table, and Si, B, and Y.

18. The coated cutting tool according to claim 3, wherein the layer (c2) contains one or two or more elements selected from elements of Groups 4a, 5a, and 6a of the periodic table, and Si, B, and Y.

19. The coated cutting tool according to claim 2, wherein a layer (a) in which a nano-beam diffraction pattern is indexed in a crystal structure of WC and whose thickness is 1 nm or more and 10 nm or less is provided between the substrate and the layer (b).

20. The coated cutting tool according to claim 3, wherein a layer (a) in which a nano-beam diffraction pattern is indexed in a crystal structure of WC and whose thickness is 1 nm or more and 10 nm or less is provided between the substrate and the layer (b).

* * * * *